US010574219B2

(12) United States Patent
Kim et al.

(10) Patent No.: US 10,574,219 B2
(45) Date of Patent: Feb. 25, 2020

(54) UNIT DELAY CIRCUIT AND DIGITALLY CONTROLLED DELAY LINE INCLUDING THE SAME

(71) Applicants: SK hynix Inc., Icheon-si Gyeonggi-do (KR); Seoul National University R&DB Foundation, Seoul (KR)

(72) Inventors: Mino Kim, Seoul (KR); Suhwan Kim, Seoul (KR); Deog-Kyoon Jeong, Seoul (KR)

(73) Assignees: SK hynix Inc., Icheon-si, Gyeonggi-do (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/000,448

(22) Filed: Jun. 5, 2018

(65) Prior Publication Data

US 2018/0358956 A1    Dec. 13, 2018

(30) Foreign Application Priority Data

Jun. 9, 2017    (KR) .......................... 10-2017-0072407

(51) Int. Cl.
*H03K 5/133*    (2014.01)
*H03H 11/26*    (2006.01)

(52) U.S. Cl.
CPC ............. *H03K 5/133* (2013.01); *H03H 11/26* (2013.01)

(58) Field of Classification Search
CPC ....... H03H 11/26; H03H 11/265; H03K 5/133
See application file for complete search history.

(56) References Cited

U.S. PATENT DOCUMENTS

| | | | |
|---|---|---|---|
| 6,348,828 B1 | 2/2002 | Barnes | |
| 6,756,832 B2 * | 6/2004 | Reuveni | H03K 5/135 327/271 |
| 7,605,628 B2 * | 10/2009 | Magee | H03K 5/131 327/261 |
| 7,634,039 B2 * | 12/2009 | Maneatis | H03L 7/07 375/376 |
| 7,644,331 B2 * | 1/2010 | Haugestuen | G01R 31/3167 327/141 |
| 7,705,687 B1 * | 4/2010 | Paz | H03K 3/0315 327/161 |
| 8,493,116 B2 * | 7/2013 | Choi | H03L 7/0814 327/147 |
| 8,564,345 B2 | 10/2013 | Yu | |
| 9,154,140 B1 * | 10/2015 | Jung | H03L 7/0812 |
| 9,350,338 B2 | 5/2016 | Faue et al. | |
| 9,362,923 B2 * | 6/2016 | Mizogami | H03L 7/0812 |
| 2010/0141323 A1 * | 6/2010 | Kim | H03K 5/133 327/261 |
| 2016/0269012 A1 * | 9/2016 | Takahashi | H03K 5/1534 |

OTHER PUBLICATIONS

Herbert Taub and Donald Schilling, Digital Integrated Electronics, 1977, McGraw-Hill, pp. 98-100 (Year: 1977).*

* cited by examiner

*Primary Examiner* — Thomas J. Hiltunen
(74) *Attorney, Agent, or Firm* — William Park & Associates Ltd.

(57) ABSTRACT

In an embodiment, a unit delay circuit comprises a first path configured to delay a first input signal to output a first output signal when a selection signal is inactivated, a second path configured delay a second input signal to output a second output signal when the selection signal is inactivated, and a third path configured to delay the first input signal to output the second output signal when the selection signal is activated.

16 Claims, 7 Drawing Sheets

UNIT DELAY CIRCUIT AND DIGITALLY CONTROLLED DELAY LINE INCLUDING THE SAME

CROSS-REFERENCE TO RELATED APPLICATIONS

The present application claims priority to Korean Patent Application No. 10-2017-0072407, filed on Jun. 9, 2017, which is incorporated herein by reference in its entirety.

BACKGROUND

1. Technical Field

Various example embodiments may generally relate to a unit delay circuit and digitally controlled delay line including the unit delay circuit where a glitch is not generated when a delay code changes.

2. Related Art

A conventional digitally controlled delay line delays an input signal by a delay amount corresponding to a delay code and outputs the delayed input signal.

The delay code can be changed and input with different values over time.

A glitch can be generated in the output signal of the digitally controlled delay line when the delay code is variably input.

When the input signal is delayed and output, a glitch may have occurred if the number of edges of the input signal and the output signal are different.

If a glitch occurred, a malfunction may be caused in a circuit using the output signal of the delay line.

For example, in a system that operates synchronously with a clock signal, if the number of edges between the input and output clock signals are different, a malfunction may occur in which states vary differently from the design.

Accordingly, there is a demand for a digitally controlled delay line in which a glitch is not generated in an output signal when a delay code is changed.

SUMMARY

In an embodiment, a unit delay circuit comprises a first path configured to delay a first input signal to output a first output signal when a selection signal is inactivated; a second path configured delay a second input signal to output a second output signal when the selection signal is inactivated; and a third path configured to delay the first input signal to output the second output signal when the selection signal is activated.

In an embodiment, a digitally controlled delay line comprises a delay circuit configured to delay an input signal by an amount corresponding to a selection code to output an output signal; a first control circuit configured to determine the selection code according to an input code; and a second control circuit configured to determine a time to update the selection code according to a state of the input signal that passes through the delay circuit, wherein the delay circuit includes a plurality of unit delay circuits each receiving a part of the selection code as a selection signal to determine whether to use a first path, a second path, and a third path.

DETAILED DESCRIPTION

Various embodiments will be described below with reference to the accompanying drawings.

Figure 1:
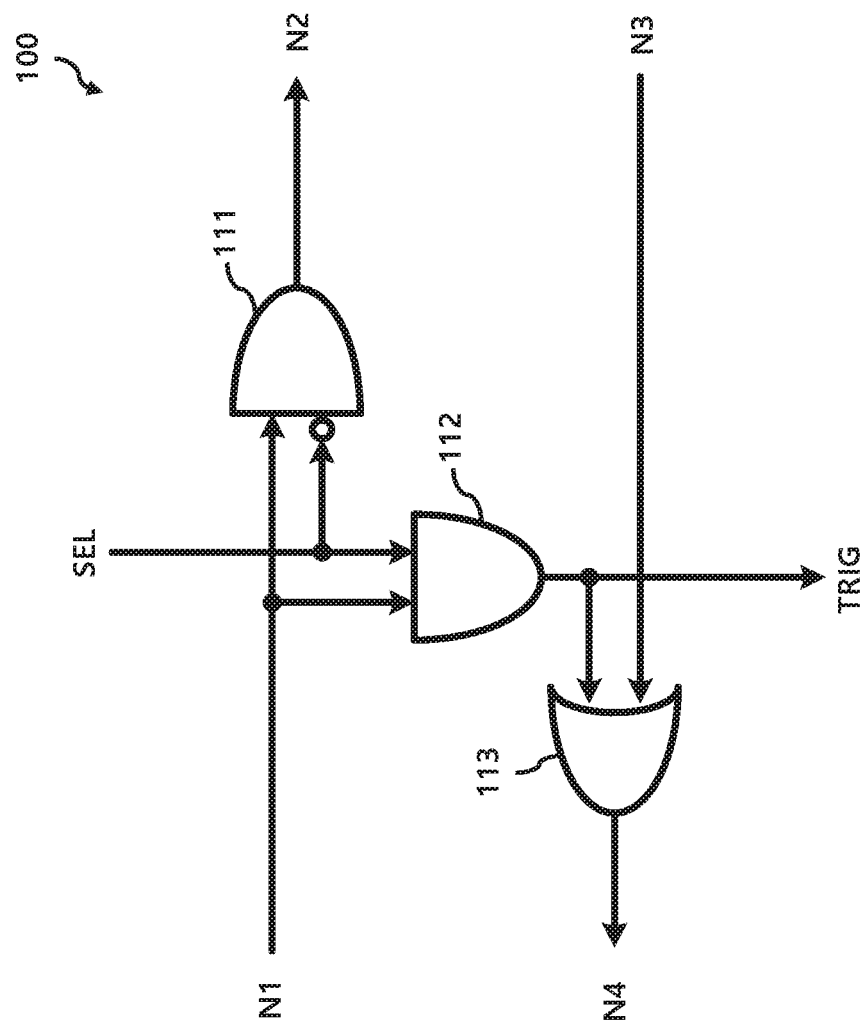
FIGS. 1 and 2 are block diagrams illustrating a unit delay circuit in accordance with an embodiment of the present disclosure.

FIG. 1 is a block diagram illustrating a unit delay circuit in accordance with an embodiment of the present disclosure.

In this embodiment, the unit delay circuit includes a first gate 111, a second gate 112, and a third gate 113.

The first gate 111 performs an AND operation on a first input signal N1 and a signal obtained by inverting a selection signal SEL and outputs a first output signal N2.

The second gate 112 performs an AND operation on the first input signal N1 and the selection signal SEL and outputs a trigger signal TRIG.

The third gate 113 performs an OR operation on a second input signal N3 and the trigger signal TRIG to output a second output signal N4.

First, the case where the selection signal SEL is activated will be described in detail.

The second input signal N3 is fixed at a low level, and the trigger signal TRIG has the same logic level as the first input signal N1.

Accordingly, the trigger signal TRIG transits to the high level after the trigger signal TRIG is delayed by one gate when the rising edge of the first input signal N1 is output.

The second output signal N4 is a signal obtained by performing an OR operation on the trigger signal TRIG and the second input signal N3.

The second input signal N3 may be at a low level when the selection signal SEL input to a unit delay circuit is activated.

In consideration of this, the second output signal N4 corresponds to a signal obtained by delaying the trigger signal TRIG by one gate.

Accordingly, when the selection signal SEL is activated, the second output signal N4 may be obtained by delaying the first input signal N1 by two gates.

Next, a case where the selection signal SEL is inactivated will be described in detail.

When the selection signal SEL is inactivated, the first output signal N2 may be obtained by delaying the first input signal N1 by one gate.

Because the trigger signal TRIG output from the second gate 112 is fixed at a low level, the second output signal N4 may be obtained by delaying the second input signal N3 by one gate.

In this way, the unit delay circuit 100 includes a first path in which the first input signal N1 is delayed and output as the first output signal N2, a second path in which the second input signal N3 is delayed and output as the second output signal N4, and a third path in which the first input signal N1 is output as the trigger signal TRIG and the second output signal N4.

When the selection signal SEL is inactivated, a signal is delayed in the first path and the second path. When the selection signal SEL is activated, a signal is delayed in the third path. When the selection signal SEL is inactivated, the first path may delay the first input signal N1 to output the first output signal N2. Further, when the selection signal SEL is inactivated, the second path may delay the second input signal N3 to output the second output signal N4. Further still, when the selection signal SEL is activated, the third path may delay the first input signal N1 to output the second output signal N4.

Accordingly, regardless of whether or not the selection signal SEL is activated, the delay time in the unit delay circuit 100 corresponds to a delay time of two gates and can be regarded as substantially equal to a delay time of two gates.

Figure 2:
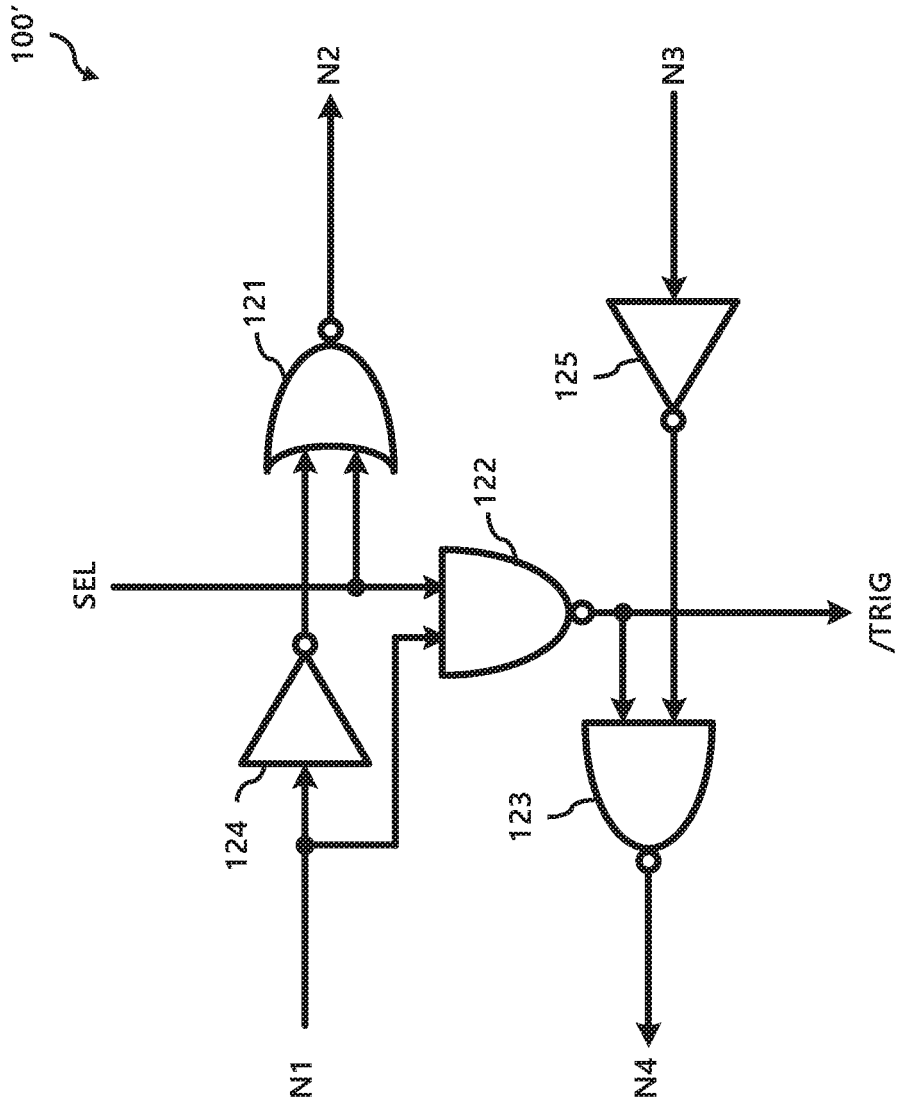

FIG. 2 is a block diagram illustrating a unit delay circuit in accordance with an embodiment of the present disclosure.

The circuit of FIG. 2 is different from the circuit of FIG. 1 in that only an inverter, a NAND gate, and a NOR gate are included. But the operation of the circuit of FIG. 2 is substantially the same as the circuit of FIG. 1.

In FIG. 2, the unit delay circuit 100' includes a NOR gate 121, NAND gates 122 and 123, and inverters 124 and 125.

When the selection signal SEL is inactivated, the first input signal N1 passes through two gates including the inverter 124 and the NOR gate 121 and is provided as the first output signal N2.

When the selection signal SEL is inactivated, the output of the NAND gate 122 is fixed to a high level, so that the second input signal N3 passes through two gates including the inverter 125 and the NAND gate 123 and is output as the second output signal N4.

When the selection signal SEL is activated, the output of the NOR gate 121 is fixed to the low level and the trigger signal TRIG has the same logic level as the first input signal N1. Further, the NAND gate 122 may perform a NAND operation on the first input signal N1 and the selection signal SEL to output an inverted trigger signal /TRIG.

At this time, the second output signal N4 is a signal obtained by performing a NAND operation on the result of a NAND operation performed on the first input signal N1 and the selection signal SEL, and the inverted second input signal N3. Thus, the NAND gate 123 may be may perform a NAND operation on the inverted second input signal N3 and the inverted trigger signal /TRIG.

As described above, the second input signal N3 is preferably set to a low level when the selection signal SEL is activated. Therefore, the first input signal N1 passes through the two NAND gates 122 and 123 and is output as the second output signal N4.

Figure 3:
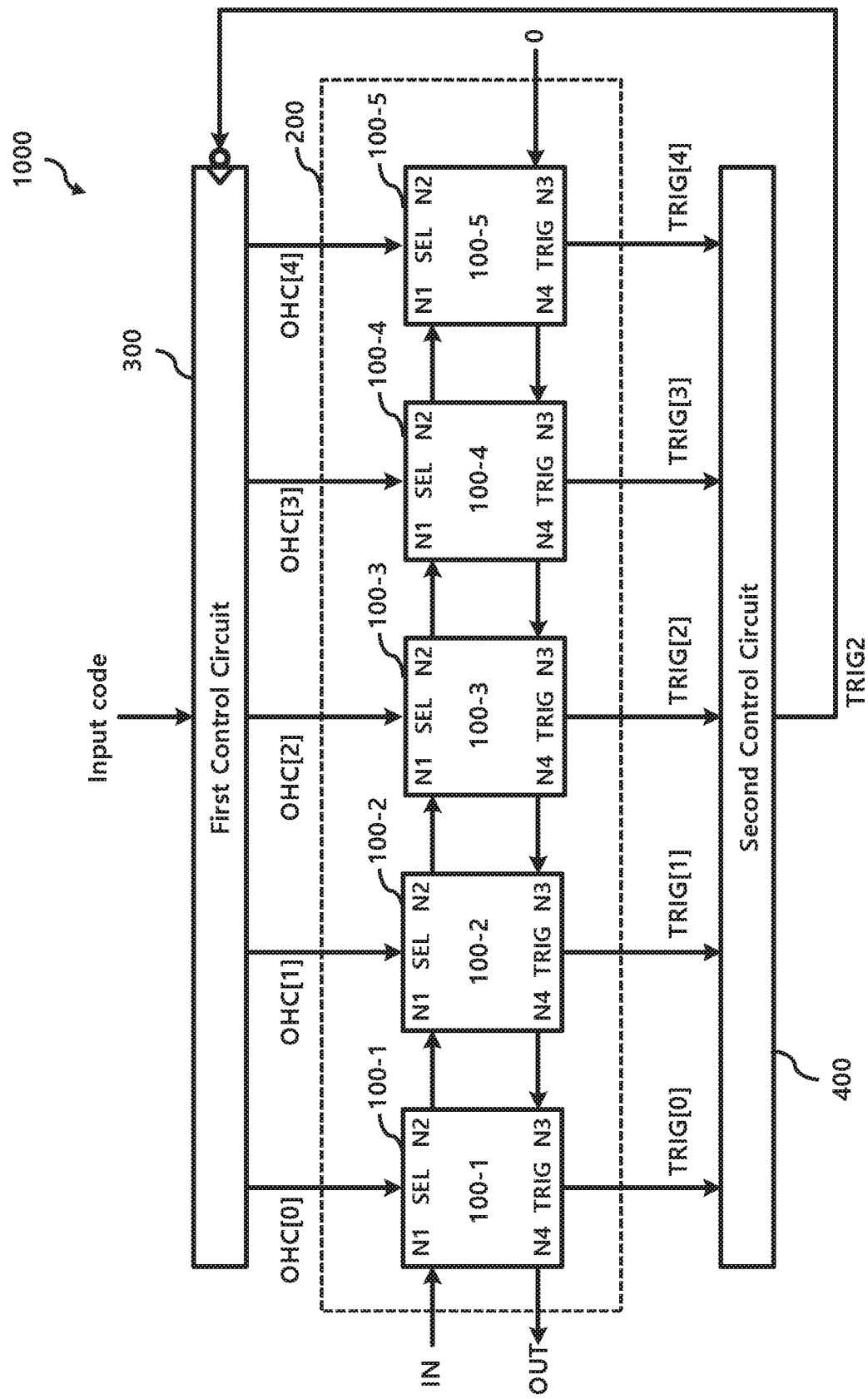
FIG. 3 is a block diagram illustrating a digitally controlled delay line according to an embodiment of the present disclosure.

FIG. 3 is a block diagram illustrating a digitally controlled delay line according to an embodiment of the present disclosure.

The digitally controlled delay line 1000 according to an embodiment of the present disclosure includes a delay circuit 200, a first control circuit 300, and a second control circuit 400.

The delay circuit 200 includes a plurality of unit delay circuits 100-1 to 100-5.

The input signal IN is applied to a node of the unit delay circuit 100-1 as the first input signal N1, and the output signal OUT is output from a node of the unit delay circuit 100-1 as the second output signal N4.

A node associated with the first output signal N2 of the unit delay circuit 100-1 is connected to a node associated with the first input signal N1 associated with the unit delay circuit 100-2 at a right side of the unit delay circuit 100-1, where the right side of the unit delay circuit 100-1 is determined based on a plan view of FIG. 3. Directions as described in relation to FIG. 3 are determined based on a plan view. Further, the first unit delay circuit 100-1 may be adjacent to the second unit delay circuit 100-2. The second unit delay circuit 100-2 may be adjacent to the third unit delay circuit 100-3, etc.

A node associated with the second output signal N4 of the unit delay circuit 100-2 is connected to a node associated with the second input signal N3 of the unit delay circuit 100-1 at a left side of the unit delay circuit 100-2.

The other unit delay circuits 100-2 to 100-5 may be connected in an analogous manner.

A low level signal is applied to a node associated with the second input terminal N3 of the unit delay circuit 100-5 at the far right side of the delay circuit 200.

A corresponding bit of a selection code (OHC [n], n=0, 1, 2, 3, 4) is applied to a node associated with a selection signal SEL of each unit delay circuit. The corresponding bit of the selection code (OHC [n], n=0, 1, 2, 3, 4) may be obtained by converting an output code determined in accordance with an input code.

For example, the least significant bit OHC [0] of the selection code is applied to a node associated with the selection signal SEL of the unit delay circuit 100-1 and the most significant bit of the code OHC [4] is applied to a node associated with the selection signal SEL of the unit delay circuit 100-5. Thus, a unit delay circuit 100-1 to 100-5 may receive a portion of the selection code OHC [n] as a selection signal SEL to set at least one of the first path, the second path, and the third path.

In this embodiment, as the magnitude of the selection code increases, the delay increases.

In this embodiment, the first control circuit 300 determines an output code according to an input code and generates a selection code corresponding to the output code.

The output code may have the same value as the input code, or the output code may have a value between a previous output code and the input code.

Hereinafter, a previous output code can be referred to as a previous code.

In this embodiment, when a difference between the input code and the previous code is large, the output code is sequentially increased from the previous code thereby preventing a glitch from occurring in the output signal OUT.

This will be described in detail with reference to FIG. 5 below.

In this embodiment, the input code and the output code are binary codes, and the selection code OHC is a one-hot code.

A one-hot code may include a group of bits where only one of the bits is high (one) and the remaining bits are low (zero). Accordingly, in the selection code, only one bit is set to one and the other bits are set to zero.

A relation between the output code and the selection code can be determined, for example, as shown in the following table.

TABLE 1

| Output code | Selection code |
|---|---|
| "001" | "00001" |
| "010" | "00010" |
| "011" | "00100" |
| "100" | "01000" |
| "101" | "10000" |

Each bit of the selection code is input to a node associated with the selection signal SEL of a corresponding unit delay circuit 100-1 to 100-5.

Accordingly, a signal is transmitted along a third path of a selected unit delay circuit 100-1 to 100-5 in which "1" is input to a node associated with the selection signal SEL, and a signal is transmitted along a first path and a second path of the unit delay circuits 100-1 to 100-5 on the left side of the selected unit delay circuit, and input signals IN and output signals OUT of the unit delay circuits on the right side of the selected unit delay circuit 100-1 to 100-5 are fixed to be low.

The first control circuit 300 updates the selection code at a falling edge of the second trigger signal TRIG2.

This means that a new selection code may be input to the delay circuit 200 when all the trigger signals TRIG [n], n=0, 1, 2, 3, 4 output from the plurality of unit delay circuits 100-1 to 100-5 are low.

This can prevent the occurrence of glitches under certain conditions, which will be described in more detail below.

In this embodiment, the second control circuit 400 may perform a binary operation such as an OR operation on the signals output from nodes associated with the trigger signal TRIG [n] of the plurality of unit delay circuits 100-1 to 100-5, and outputs the second trigger signal TRIG2.

Hereinafter, an operation method of the digitally controlled delay line for preventing a glitch from occurring in the present disclosure will be described.

In the following description, it is assumed that the input signal IN has a duty ratio of R where R is greater than 0 and less than 1 (0<R<1).

This means that when the period of the input signal IN is T, the width of the high level section of the input signal IN corresponds to R×T and the width of the low level section of the input signal IN corresponds to (1−R)×T.

In this embodiment, a glitch is prevented from occurring when the number of edges of the input signal IN and the output signal OUT are not equal.

In the present disclosure, to prevent the glitch, a delayed pulse is generated from the newly inputted code after the pulse, delayed by the previously inputted code, completes the rising edge and the falling edge.

Thus, the number of edges of the input signal IN and output signal OUT are kept the same by preventing the pulses of the previously input code and the newly input code from overlapping.

Hereinafter, it is assumed that the value of the existing output code is N and the value of the new input code is M (M and N are natural numbers).

In this case, the value of the code is a decimal value corresponding to the binary code. In the following, it is assumed that the total delay time is derived by multiplying the value of the code by the delay time Td of the unit delay circuit 100-1 to 100-5. That is, if the value of the output code is M, the total delay time is assumed to be calculated as M×Td.

First, a condition under which glitches do not occur will be described when M is greater than or equal to N.

When M is greater than or equal to N, the selection signal SEL of the unit delay circuit (hereinafter referred to as the first unit delay circuit) in which the present selection signal is inactivated, and the selection signal SEL of a unit delay circuit (hereinafter referred to as the second unit delay circuit) at the right side of the first unit delay circuit changes from the inactivated state to the activated state.

If the trigger signal TRIG is activated in the current unit delay circuit, a high level pulse passes through the third path of the current unit delay circuit. Therefore, when the selection signal SEL is changed, a distortion occurs in a pulse shape.

In order to prevent this, it is preferable that the selection signal SEL is changed when the trigger signal TRIG of the current unit delay circuit is a low level.

This can prevent a glitch phenomenon by updating the selection code at the falling edge of the second trigger signal TRIG2. Also, the second control circuit 400 may control the first control circuit 300 to update the selection code when a pulse does not pass through the third path of every unit delay circuit 100-1 to 100-5.

Next, a condition under which glitches do not occur will be described, when M is less than N.

When M is less than N, the selection signal SEL of the unit delay circuit (first unit delay circuit) in which the present selection signal SEL is inactivated and the selection signal SEL of the unit delay circuit (hereinafter referred to as the third unit delay circuit) at the left side of the first unit delay circuit 100-1 changes from the inactivated state to the activated state.

At this time, first and second pulses which are adjacent to each other in the input signal IN are considered. At this time, it is assumed that the first pulse is a pulse preceding the second pulse.

The first pulse has a delay amount corresponding to M and the second pulse has a delay amount corresponding to N.

The rising edge of the second pulse should not be outputted from the third unit delay circuit after the falling edge of the first pulse is outputted from the third unit delay circuit via the first unit delay circuit 100-1 in order to prevent a glitch.

If the time taken for the falling edge of the first pulse of the input signal IN to be output as the second output signal N4 of the third unit delay circuit 100-3 is T1, and the time taken for the rising edge of the second pulse to be output as the second output signal N4 of the third unit delay circuit 100-3 is T2, the following relation must be established in order to prevent glitches.

$$T1<T2+(1-R)T$$

Where, T1−T2 corresponds to the time taken for the signal output from a node associated with the first output signal N2 of the third unit delay circuit 100-3 to be input to a node associated with the second input signal N3 of the third unit delay circuit 100-3 via the first unit delay circuit 100-1.

Accordingly, the following relationship holds.

$$(N-M)Td<(1-R)T$$

$$N-M<(1-R)T/Td$$

Thus, when M is less than N, the difference between M and N must be less than the threshold value of (1−R) T/Td to prevent the occurrence of glitches.

Figure 4:
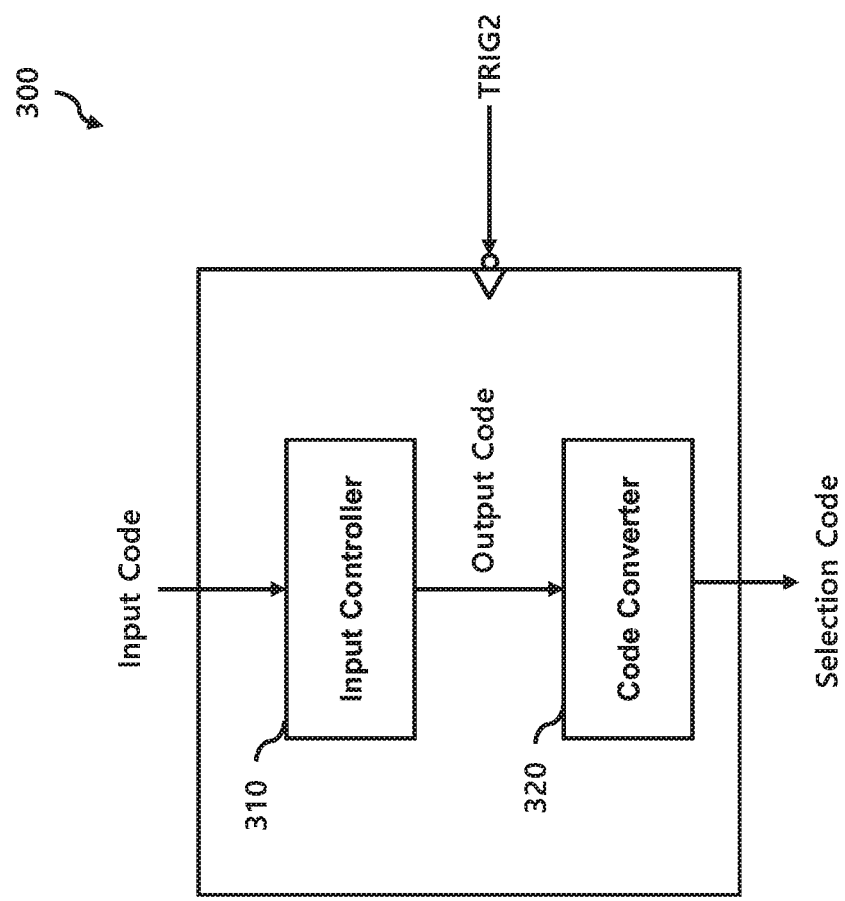
FIG. 4 is a block diagram illustrating a first control circuit according to an embodiment of the present disclosure.

FIG. 4 is a block diagram illustrating a first control circuit according to an embodiment of the present disclosure.

The first control circuit 300 updates the selection code on a falling edge of the second trigger signal TRIG2.

The first control circuit 300 includes an input control circuit or input controller 310 and a code converter circuit or code converter 320.

The input controller 310 determines an output code according to an input code and a previous output code, that is, a previous code.

The code converter 320 converts the determined output code into a selection code and outputs the selection code.

Figure 5:
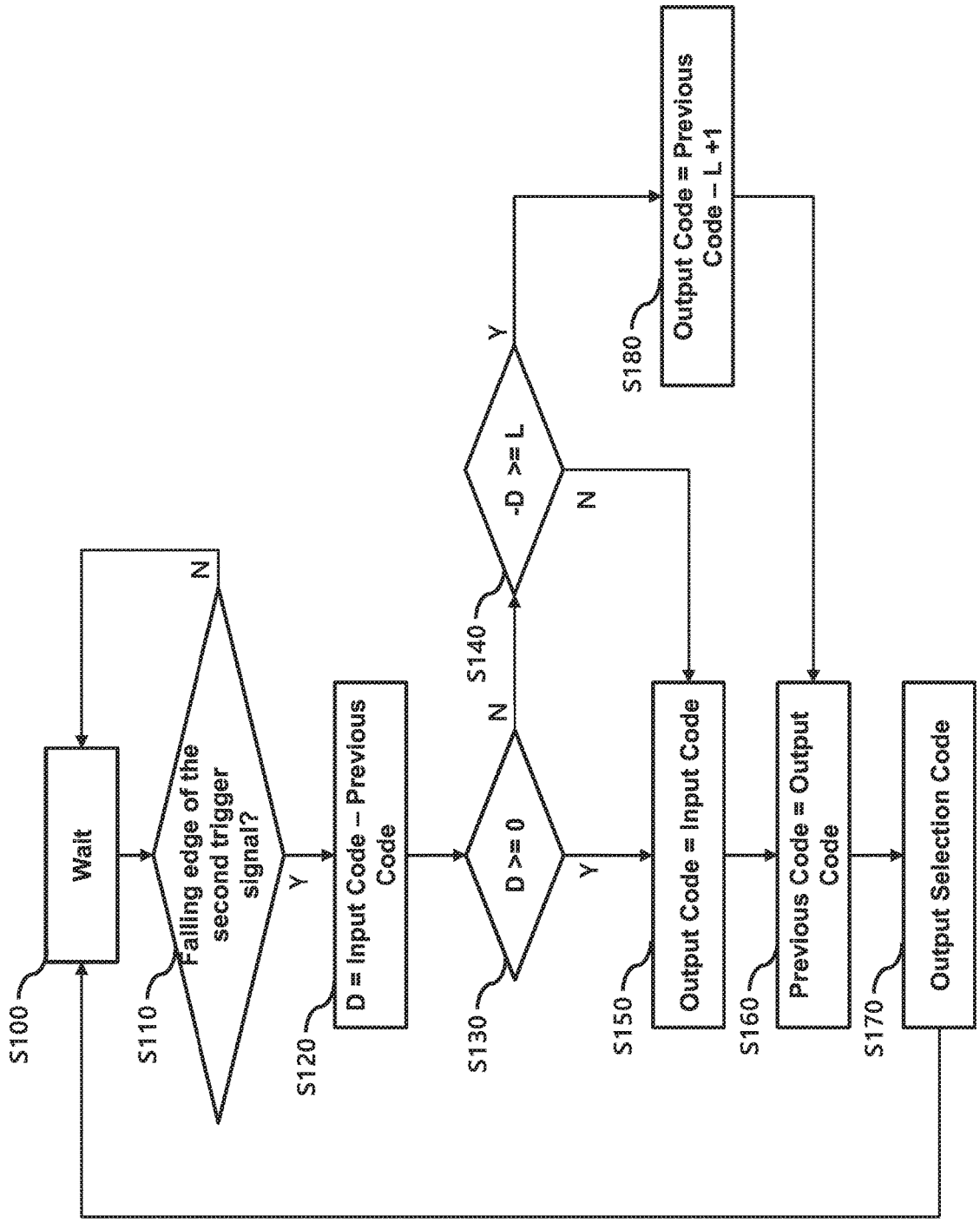
FIG. 5 is a state diagram of a code input circuit according to an embodiment of the present disclosure.

FIG. 5 is a state diagram of a code input circuit according to an embodiment of the present disclosure.

In step S110, the first control circuit 300 determines whether a falling edge of the second trigger signal TRIG2 is detected. If a falling edge of the second trigger signal TRIG2 is not detected, the process goes back to the wait state S100.

If the first control circuit 300 detects a falling edge of the second trigger signal TRIG2, the first control circuit 300 sets the value of D to the value obtained by subtracting the value of the previous code from the value of the input code at S120.

Then, the first control circuit 300 determines whether D is greater than or equal to 0 at S130.

If D is greater than or equal to 0, the first control circuit 300 sets the input code as the output code at S150, and the first control circuit 300 sets the output code to the previous code at S160.

Thereafter, the first control circuit 300 generates and outputs a selection code corresponding to the output code at S170, and the process returns to the wait state S100.

If D is negative in step S130, that is, if the value of the input code is less than the value of the previous code, the first control circuit 300 determines whether the magnitude of D is greater than or equal to a threshold value L at S140.

If the magnitude of D is less than the threshold value, the process proceeds to step S150. If the magnitude of D is greater than or equal to the threshold value, the value of the output code is determined to be the difference between the previous code and the threshold minus 1 at step S180.

In this embodiment, a value obtained by subtracting the threshold value from the value of the previous code and adding 1 is set as the output code.

Thereafter, the process goes to step S160.

Figure 6:
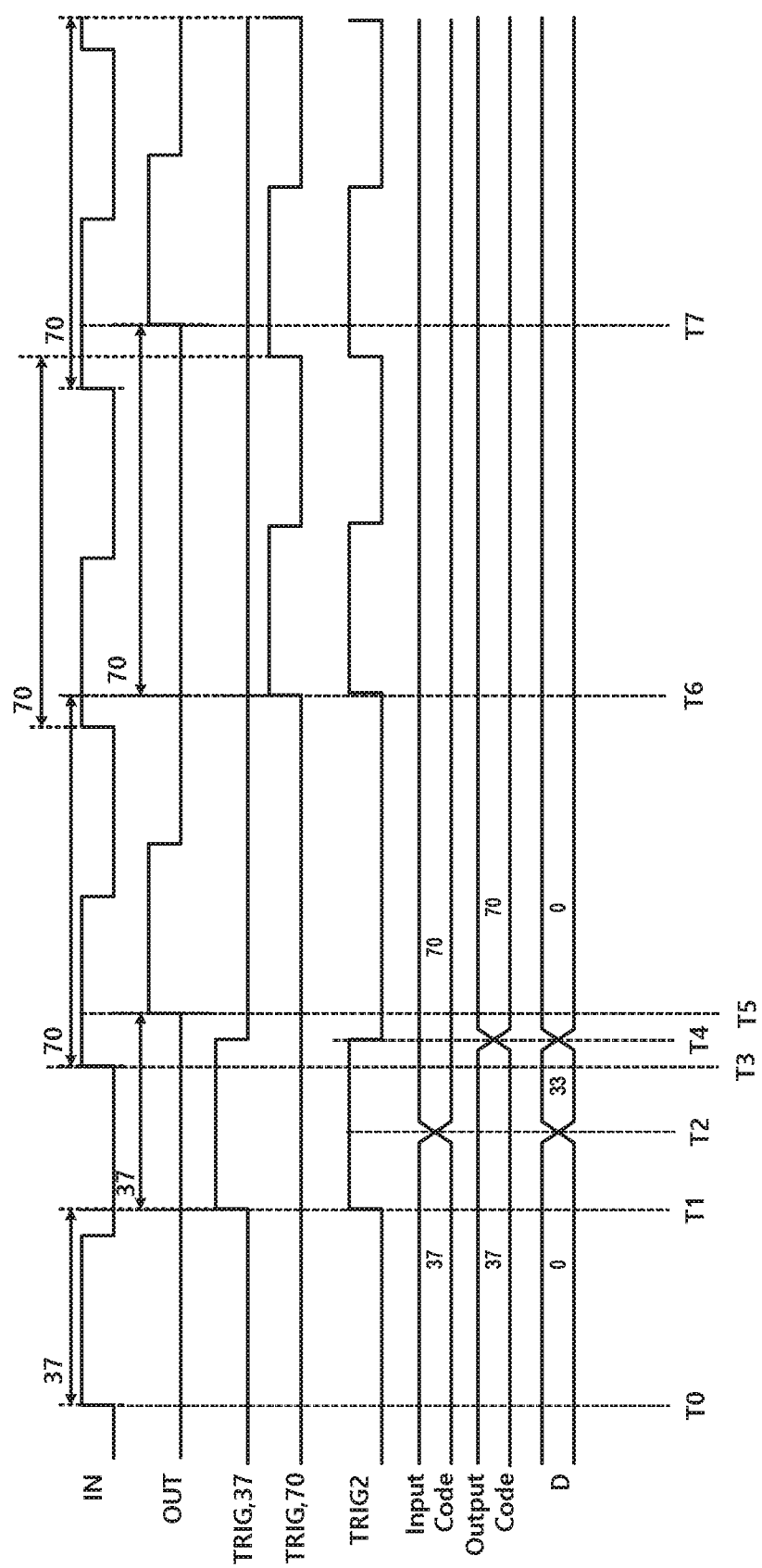
FIGS. 6 and 7 are timing diagrams illustrating operations of a digitally controlled delay line according to an embodiment of the present disclosure.
Figure 7:
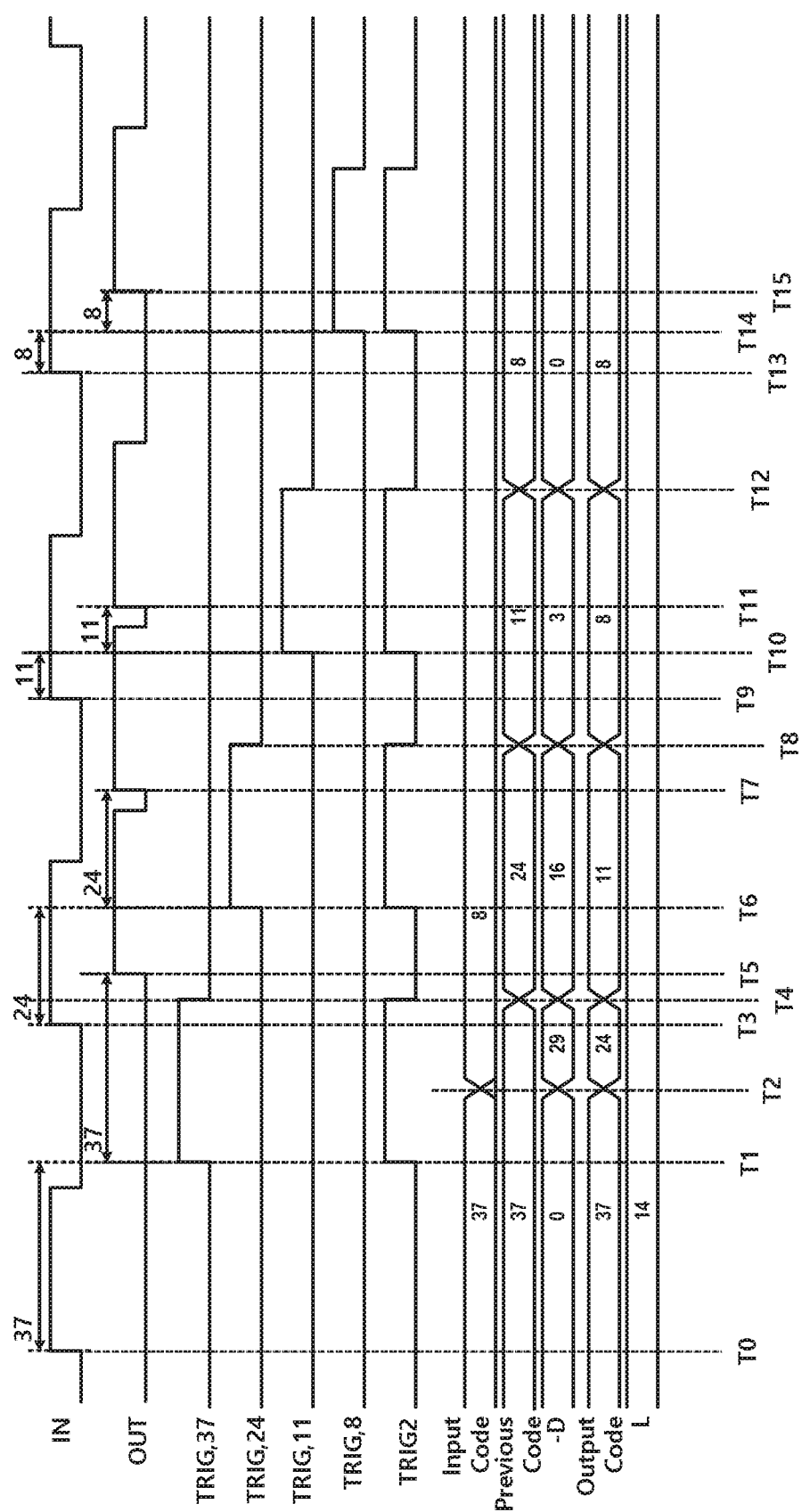

FIGS. 6 and 7 are timing diagrams illustrating operations of a digitally controlled delay line according to an embodiment of the present disclosure.

In FIG. 6, it is assumed that the value of the input code increases from 37 to 70, and the value of the initial output code is 37.

Hereinafter, it is assumed that the 37th unit delay circuit is selected when the output code is 37, and the 70th unit delay circuit is selected when the output code is 70.

At T1, the trigger signal of the 37th unit delay circuit TRIG,37 corresponding to the value 37 of the output code which transits to the high level after a delay time corresponding to the output code value of 37.

As a result, the second trigger signal TRIG2 also transits to the high level.

At T2, a new input code 70 is applied and the difference between the input code and the output code is computed as 33.

At T3, the second rising pulse is input as the input signal IN.

At time T4, the trigger signal TRIG,37 transits to the low level and the delay circuit 200 is controlled according to the new output code 70.

At T5, a rising pulse started from the trigger signal TRIG,37 is output as the output signal OUT from the first unit delay circuit 100-1.

T4 occurs before the rising pulse generated at T3 arrives at the 37th unit delay circuit, therefore the rising pulse generated at T3 passes through the 37th unit delay circuit and passes to the 70th unit delay circuit corresponding to the new output code 70.

As a result, the trigger signal of the 70th unit delay circuit TRIG,70 transits to the high level at T6.

At T7, the rising pulse started from the trigger signal of the 70th unit delay circuit TRIG,70 is output as the output signal OUT from the first unit delay circuit 100-1.

In FIG. 7, it is assumed that the value of the input code decreases from 37 to 8, and the value of the initial output code is 37.

At T0, the first rising pulse of the input signal IN is input.

At T1, the trigger signal TRIG,37 transits to the high level, and accordingly the second trigger signal TRIG2 transits to the high level.

At T2 a new input code 8 is input.

Because the difference between the previous code and the new input code 8 is 29, which is greater than the threshold value 14, a new output code is calculated as 24 (=37−14+1).

The new output code is output at T4 when the second trigger signal TRIG2 transits to the low level, thereby updating the output code and the previous code.

A second rising pulse of the input signal IN is applied at T3 and this pulse has a delay amount corresponding to the new output code 24.

At T4, the difference between the input code and the previous code is 16, which is greater than the threshold value 14, so the new output code is calculated as 11 (=24−14+1).

The new output code is output at T4 when the second trigger signal TRIG2 transits to the low level, thereby updating the output code and the previous code.

At T5, a rising pulse started from the trigger signal TRIG,37 is output as the output signal OUT from the first unit delay circuit 100-1.

The trigger signal of the 24th unit delay circuit TRIG,24 at T6 transits to the high level, and the second trigger signal TRIG2 transits to the high level accordingly.

At T7, the rising pulse started from the trigger signal TRIG,24 is outputted as the output signal OUT from the first unit delay circuit 100-1.

The new output code is output at T8 when the second trigger signal TRIG2 transits to the low level, thereby updating the output code and the previous code.

At T9, a third rising pulse of the input signal IN is applied and this pulse has a delay amount corresponding to the new output code 11.

The trigger signal of the eleventh unit delay circuit TRIG,11 at T10 transits to the high level, and the second trigger signal TRIG2 transits to the high level accordingly.

At T11, the rising pulse started from the trigger signal TRIG,11 is output as the output signal OUT from the first unit delay circuit 100-1.

At T8, a difference between the input code and the previous code is 3, which is less than the threshold value 14, so the new output code is calculated as 8.

The new output code is output at T12 when the second trigger signal TRIG2 transits to the low level, thereby updating the output code and the previous code.

At T8, the fourth rising pulse of the input signal IN is applied and this pulse has a delay amount corresponding to the new output code 8.

The trigger signal of the eighth unit delay circuit TRIG,8 at T14 transits to the high level and the second trigger signal TRIG2 transits to the high level accordingly.

A rising pulse started from the trigger signal TRIG,8 at T15 is output as the output signal OUT from the first unit delay circuit 100-1.

In the embodiment shown in FIG. 7, when the input code is less than the previous code and the difference thereof is greater than the threshold value, the output code is sequentially decreased in several steps to suppress the occurrence of a glitch.

Although various embodiments have been described for illustrative purposes, it will be apparent to those skilled in the art that various changes and modifications may be made without departing from the spirit and scope of the disclosure as defined in the following claims.

What is claimed is:

1. A digitally controlled delay line comprising:
a delay circuit configured to delay an input signal by an amount corresponding to a selection code to output an output signal;
a first control circuit configured to determine the selection code according to an input code; and
a second control circuit configured to determine a time to update the selection code according to a state of the input signal that passes through the delay circuit,
wherein the delay circuit includes a plurality of unit delay circuits each receiving a portion of the selection code as a selection signal to determine whether to use a first path, a second path, and a third path, and
wherein the plurality of unit delay circuits outputs a plurality of trigger signals and the second control circuit determines the state of the input signal that passes through the delay circuit according to the plurality of trigger signals.

2. The digitally controlled delay line of claim 1, wherein each of the plurality of unit delay circuits comprises:
a first path configured to delay a first input signal to output a first output signal when the selection signal is inactivated;
a second path configured delay a second input signal to output a second output signal when the selection signal is inactivated; and
a third path configured to delay the first input signal to output the second output signal when the selection signal is activated.

3. The digitally controlled delay line of claim 2, wherein the first path includes a first gate configured to perform a logic operation on the first input signal and the selection signal to output the first output signal, the third path includes a second gate configured perform a logic operation on the first input signal and the selection signal to output a trigger signal and the second path includes a third gate configured to perform a logic operation on the trigger signal and the second input signal to output the second output signal.

4. The digitally controlled delay line of claim 2, wherein the first path includes an inverter for inverting the first input signal to output an inverted first input signal and includes a NOR gate for performing a NOR operation on the inverted first input signal and the selection signal to output the first output signal, the third path includes a NAND gate for performing a NAND operation on the first input signal and the selection signal to output an inverted trigger signal, and the second path includes an inverter for inverting the second input signal to output an inverted second input signal and a NAND gate for performing a NAND operation on the inverted second input signal and the inverted trigger signal.

5. The digitally controlled delay line of claim 2, wherein the plurality of unit delay circuits include a first unit delay circuit and a second unit delay circuit adjacent to each other, and
wherein a first output signal of the first unit delay circuit is input as a first input signal of the second unit delay circuit and a second output signal of the second unit delay circuit is input as a second input signal of the first unit delay circuit.

6. The digitally controlled delay line of claim 1, wherein each of the plurality of unit delay circuits outputs a corresponding trigger signal among the plurality of trigger signals which indicates whether a pulse signal is passing through a third path.

7. The digitally controlled delay line of claim 1, wherein the second control circuit is configured to control the first control circuit to update the selection code when a pulse signal does not pass through a third path of every unit delay circuit.

8. The digitally controlled delay line of claim 1, wherein the first control circuit generates the selection code using the first code which falls between an input code and a previous code which is used to generate a previous selection code when the input code is less than the previous code by an amount greater than or equal to a threshold value.

9. The digitally controlled delay line of claim 8, wherein the first control circuit generates the selection code using a second code between the input code and the first code when the input code is less than the first code by an amount greater than or equal to the threshold value.

10. The digitally controlled delay line of claim 8, wherein the first control circuit generates the selection code using the input code when the input code is not less than the previous code by an amount greater than or equal to the threshold value.

11. The digitally controlled delay line of claim 8, wherein the threshold value is $(1-R) \times T/Td$, wherein T is a period of the input signal, $R(0<R<1)$ is a duty ratio of the input signal, and Td is a delay time of a unit delay circuit.

12. The digitally controlled delay line of claim 8, wherein the first control circuit includes:
an input controller configured to determine an output code according to the input code and the previous code; and
a code converter configured to convert the output code into the selection code.

13. The digitally controlled delay line of claim of claim 12, wherein the first control circuit updates the selection code based on values of the plurality of trigger signals.

14. The digitally controlled delay line of claim 1, wherein the input code is a binary code and the selection code is a one-hot code.

15. The digitally controlled delay line of claim 1, wherein the second control circuit is configured to perform a binary operation on the plurality of trigger signals.

16. The digitally controlled delay line of claim 1, wherein the delay circuit is configured to receive a new selection code if all the plurality of trigger signals are set to a same level.

* * * * *